United States Patent
Mun et al.

[19]

[11] Patent Number: 5,912,565
[45] Date of Patent: Jun. 15, 1999

[54] OPERATION CONTROL CIRCUIT OF POWER SUPPLY UNIT

[75] Inventors: Jin Suk Mun; Yoon Taek Choi, both of Ichon-shi, Rep. of Korea

[73] Assignee: Hyundai Electronics Industries Co., Ltd., Ichon-shi, Rep. of Korea

[21] Appl. No.: 08/777,198

[22] Filed: Dec. 27, 1996

[30] Foreign Application Priority Data

Dec. 29, 1995 [KR] Rep. of Korea ............ 95-66020

[51] Int. Cl.⁶ .................................................. H03K 5/19
[52] U.S. Cl. .................................................. 327/20; 327/26
[58] Field of Search .................................. 327/18, 20, 23, 327/26, 31, 38, 545, 142, 143

[56] References Cited

U.S. PATENT DOCUMENTS

| | | | |
|---|---|---|---|
| 4,686,483 | 8/1987 | Isshiki et al. | 328/165 |
| 4,908,582 | 3/1990 | Kawano et al. | 331/1 |
| 5,377,156 | 12/1994 | Watanabe et al. | . |
| 5,396,116 | 3/1995 | Watanabe et al. | . |

Primary Examiner—Timothy P. Callahan
Assistant Examiner—Maria Hasanzadah
Attorney, Agent, or Firm—Thelen Reid & Priest LLP

[57] ABSTRACT

The disclosure is an operation control circuit of a power supply unit in a memory device which outputs a given operation control signal used for supplying a power supply voltage when a main control signal of the memory device is operating and additionally outputs the operation control signal in response to a sub control signal driven when the main control signal does not operate. The aforementioned operation control circuit includes: a pulse generator receiving the sub control signal to output a first and a second pulse signals; a latch receiving the first pulse signal of the pulse generator; a delay sensing circuit receiving the first and second pulse signals of the pulse generator to sense whether or not the sub control signal is continuously applied, and resetting the latch after a given time of delay; and an actuating signal generator of a power supply unit generating an operation control signal for making the power supply unit operate even when the sub control signal is continuously input during a given period of time as well as when the main control signal is operating.

6 Claims, 3 Drawing Sheets

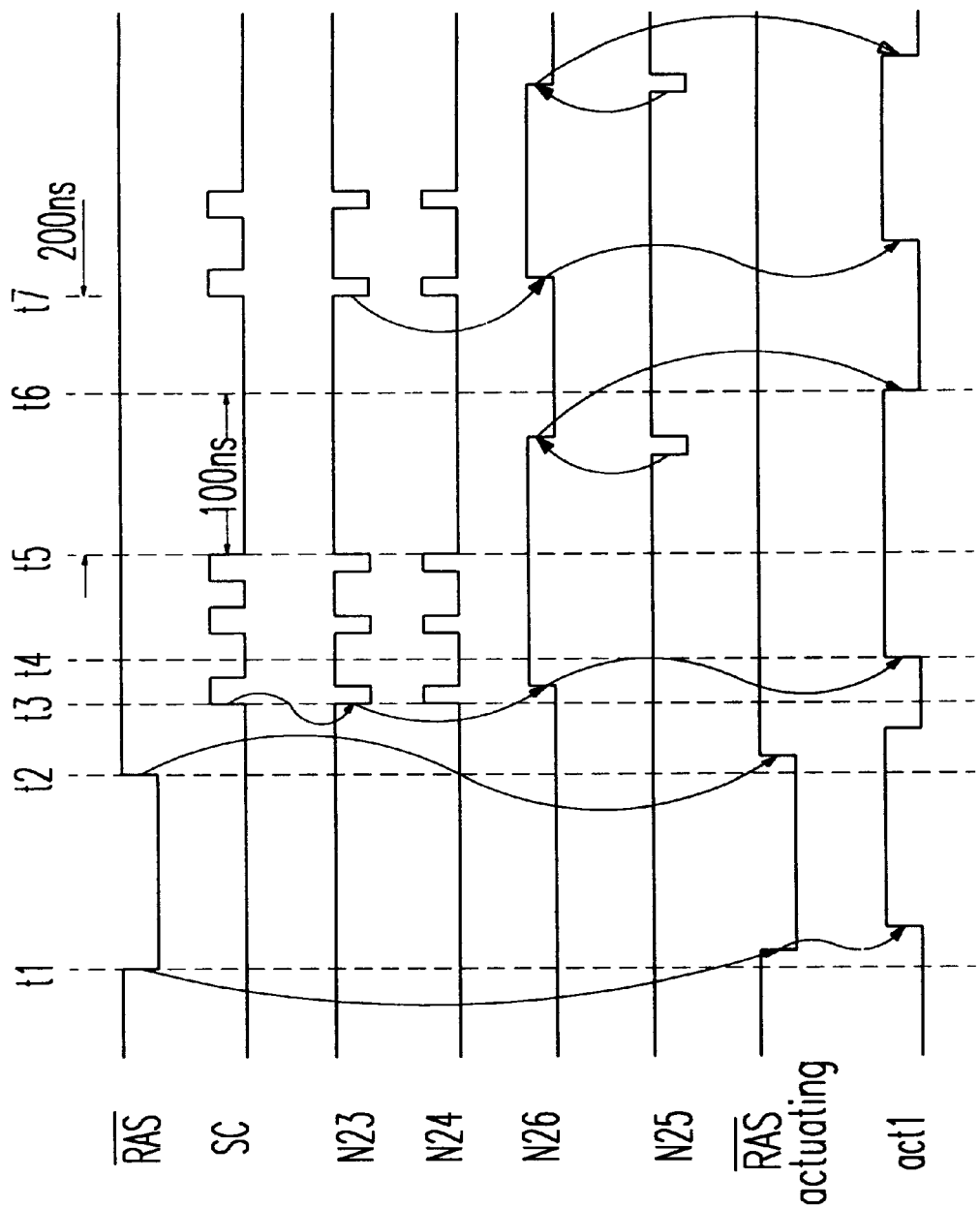

OPERATION CONTROL CIRCUIT OF POWER SUPPLY UNIT

BACKGROUND OF THE INVENTION

1. Field of the Invention

The present invention relates to an operation control circuit of a power supply unit used in a memory device, and more particularly to an operation control circuit of a power supply unit capable of making a power supply unit operate even in a section where a row address strobe (hereinafter is referred to as /RAS, hereinafter) signal that is one of control signals of a memory device does not operate.

2. Description of the Prior Art

In general, an operation control circuit of a power supply unit is used for supplying power to a memory device in response to a given control signal.

As shown in FIG. 1, a conventional operation control circuit of a power supply unit generates an actuating signal (act1) for actuating an internal power supply unit only in an operating section of /RAS. Accordingly, a signal and data access signal, etc., operating in a section where the /RAS does not operate can not be supplied with sufficient power and thereby, a speed delay is caused.

SUMMARY OF THE INVENTION

Accordingly, the present invention is directed to an operation control circuit of a power supply unit that substantially obviates one or more of the problems due to limitations and disadvantages of the related art.

An object of the present invention is to provide an operation control circuit of a power supply unit capable of reducing data access time by making the power supply unit operate in a section where a row address strobe bar signal does not operate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an operation control circuit of a power supply unit in a memory device which outputs a given operation control signal used for supplying a power supply voltage when a main control signal of the memory device is operating and additionally outputs the operation control signal in response to a sub control signal driven when the main control signal does not operate, includes: a pulse generator receiving the sub control signal to output a first and a second pulse signals; a latch receiving the first pulse signal of the pulse generator; a delay sensing circuit receiving the first and second pulse signals of the pulse generator to sense whether or not the sub control signal is continuously applied, and resetting the latch after a given time of delay; and an actuating signal generator of a power supply unit generating an operation control signal for making the power supply unit operate even when the sub control signal is continuously input during a given period of time as well as when the main control signal is operating, the latch further receiving an output signal of the delay sensing circuit, the second pulse signal of the pulse generator receiving an output signal of the delay sensing circuit, and the actuating signal generator receiving an operation signal of a reverse signal of an output signal of the latch and said main control signal.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will be more clearly understood from the following detailed description taken in conjunction with the accompanying drawings, in which:

FIG. 3, which is made up of FIGS. 3A, 3B, 3C, 3D, 3E, 3F, 3G, and 3H, shows an operation timing diagrams of an operation control circuit of a power supply unit in accordance with the present invention of FIG. 2.

DETAILED DESCRIPTION OF THE PREFERRED EMBODIMENTS

Reference will now be made in detail to the preferred embodiments of the present invention, examples of which are illustrated in the accompanying drawings.

Figure 1:
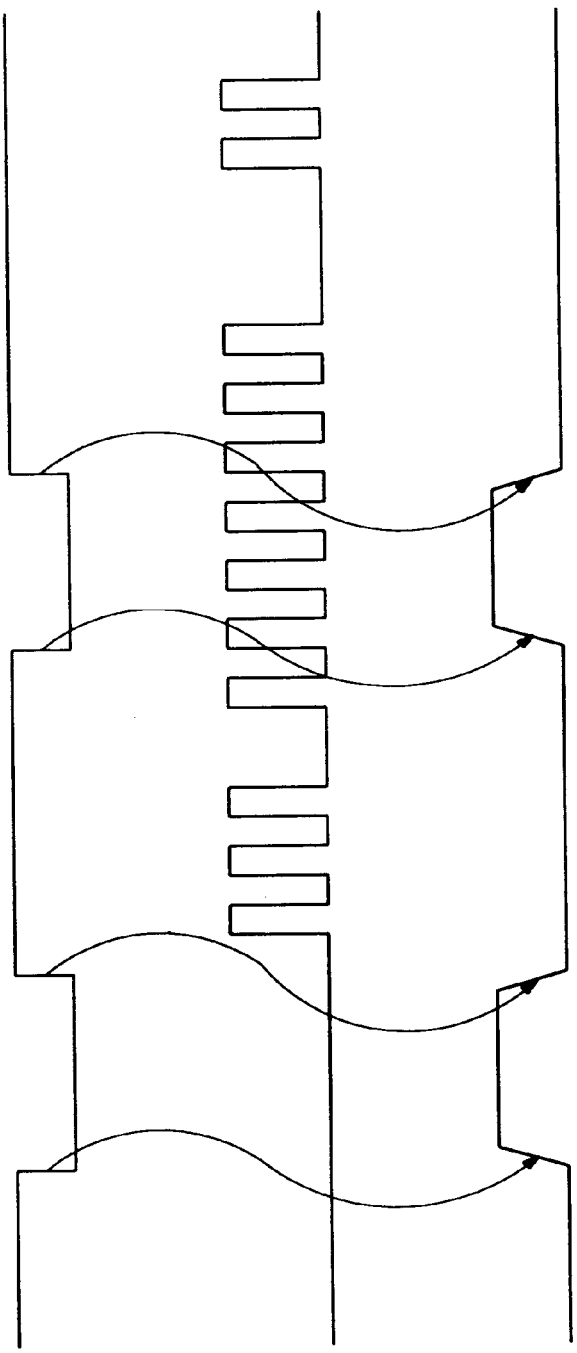
FIG. 1 show a timing diagram of an output signal of an operation control circuit of a conventional power supply unit.
Figure 2:
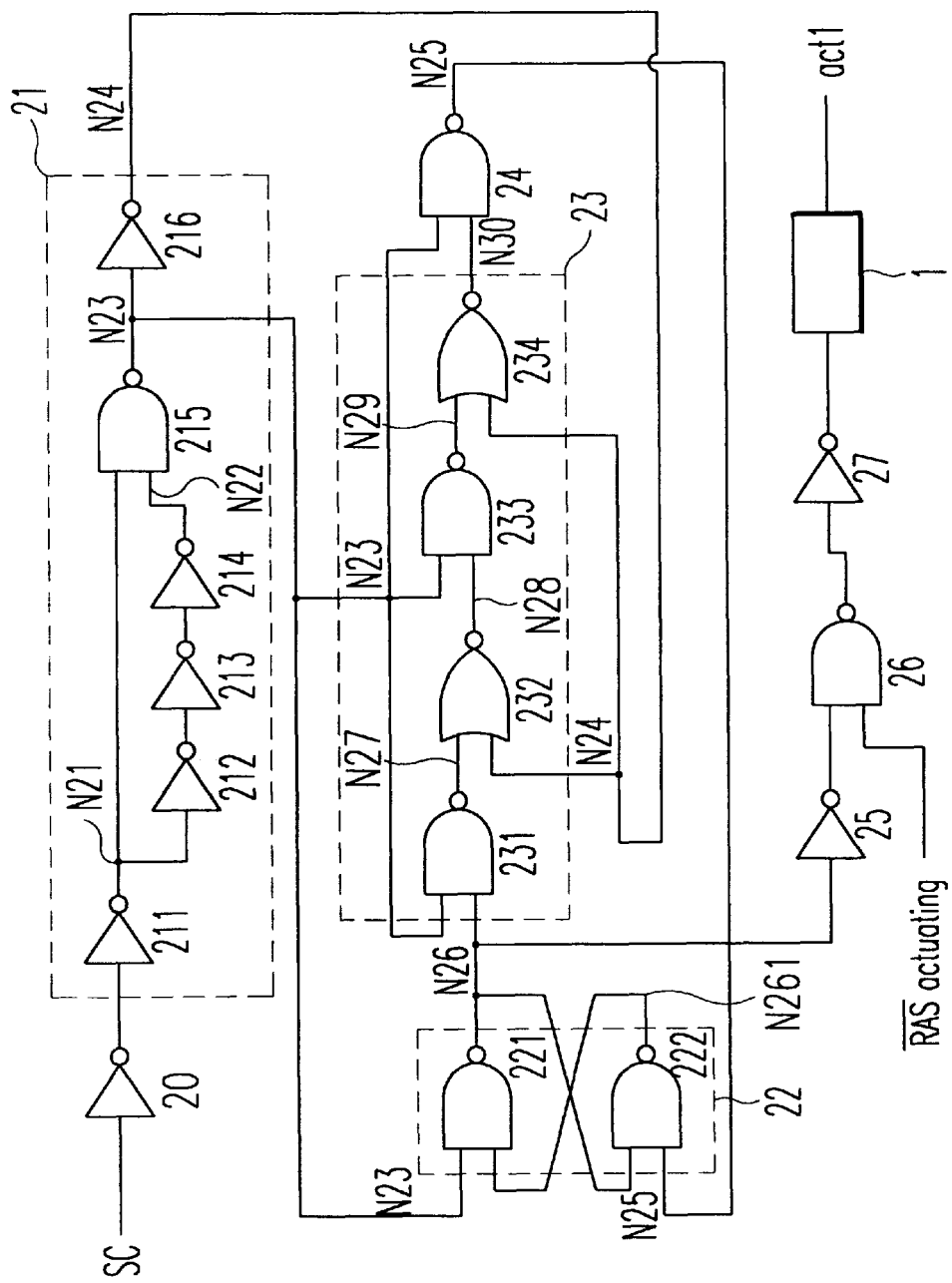
FIG. 2 is a view showing an operation control circuit of a power supply unit in accordance with an embodiment of the present invention.

In FIG. 2, a main control signal is denoted as /RAS and a sub control signal (serial access clock: SC) is denoted as SC. As shown in FIG. 2, the operation control circuit of the power supply unit of the present invention is comprised of: a power supply unit actuating signal generator 1 generating an actuating signal act1 of the power supply unit; a pulse generator 21 receiving SC signal to generate a pulse signal of the same phase as that of SC and a pulse signal of a different phase from that of SC signal; a latch 21 receiving an output signal of the pulse generator 21 to control an operation of the power supply unit actuating signal generator 1; and a delay sensing circuit 23 sensing whether or not a pulse signal output by the SC signal input through the pulse generator 21 is continuously applied, and resetting the latch 22 after a given time of delay.

The pulse generator 21 comprises: a first inverter 211 inverting the SC signal; a second inverter 212 inverting a reverse signal of the first inverter 211; a third inverter 213 inverting a reverse signal of the second inverter 212; a fourth inverter 214 inverting a reverse signal of the third inverter 213; a first NAND gate 215 NANDing an output signal of the first inverter and an output signal of the fourth inverter 214; and a fifth inverter 216 inverting an output signal of the first NAND gate 215.

The latch 22 comprises: a second NAND gate 221 inputting an output signal of the first NAND gate 215 of the pulse generator 21 at its first input terminal; and a third NAND gate inputting an output signal of the NAND gate 24 obtained by NANDing an output signal of the delay sensing circuit 23 and an output signal of the first NAND gate 215 at its second input terminal. Herein, an output of the third NAND gate 222 is applied to the second input terminal of the second NAND gate 221.

The above-mentioned delay sensing circuit 23 comprises: a fourth NAND gate 231 NANDing an output signal of the first NAND gate 215 of the pulse generator 21 and an output signal of the latch 22; a first NOR gate 232 NORing an output signal of the fifth inverter 216 of the pulse generator 21 and an output signal of the fourth NAND gate 231; a fifth NAND gate 233 NANDing an output signal of the first NAND gate 215 of the pulse generator 21 and an output signal of the first NOR gate 232; and a second NOR gate 234 NORing an output signal of the fifth inverter 216 of the pulse generator 21 and an output signal of the fifth NAND gate 215.

As shown in FIG. 3A, if /RAS is changed from a logic "high" state to a logic "low" state at point t1, the actuating signal act1 of the power supply unit is changed from the logic "low" state to the logic "high" state, thereby driving the power supply unit.

After that, because the SC signal at point t2 was not applied to the operation control circuit of the power supply unit, a node N26 which is an output node is the logic "low" state and is then inverted into the logic "high" state through the inverter 25 to be applied to the first input terminal of the NAND gate 26. If /RAS is changed from the logic "low" state to the logic "high" state, the /RAS actuating signal is also changed from the logic "low" state to the logic "high" state to be applied to the second input terminal of the NAND gate 26.

Thus, the output of the NAND gate 26 is in the logic "low" state and is then inverted into the logic "high" state to be applied to the power supply unit actuating signal generator 1.

Next, as shown in FIG. 3B, the SC signal which was changed from the logic "low" state to the logic "high" state at a point t3 is inverted into the logic "low" state through the inverter 20 to be applied to the first inverter 211 of the pulse generator 21.

Thereby, the logic "low" signal is inverted into the logic "high" state through the first inverter 211. That is, a node N21 becomes the logic "high" state, and after being delayed during a given period of time through the second, third and fourth inverters 212, 213 and 214, the logic "high" output signal of the first inverter 211 becomes the logic "low" state and thereby, a node N22 becomes the logic "low" state/

At this time, as shown in FIG. 3C, the output of the first NAND gate 215, i.e., a node N23, is changed from the logic "high" state to the logic "low" state because the node N21 is the logic "high" state and the node N22 is logic "low" state, and it is changed to the logic "high" state through the fifth inverter 216 as shown in FIG. 3D. That is, the node N24 becomes the logic "high" state.

Then, the node N23 is logic "low" state and therefore, the output of the NAND gate 24 that is a node N25 is the logic "high" state.

The output of the latch 22, i.e., a node N26, becomes the logic "high" state because the node N23 is logic "low" state and the node N25 is the logic "high" state, as shown in FIG. 3E.

Accordingly, the logic "high" signal of the node N26 is inverted into the logic "low" signal through the inverter 25 to be applied to the first input terminal of the NAND gate 26. At this time, if the /RAS actuating signal changed from the logic "low" state to the logic "high" state is applied to the second input terminal of the NAND gate 26, the output of the NAND gate 26 becomes the logic "high" state.

The output signal of the logic "low" state of NAND gate 26 is applied to inverter 27. The output of inverter 27 is applied to the power supply unit actuating signal generator. Then, the actuating signal of the power supply unit which was the logic "low" state is changed to the logic "high" state at the point t4 to be generated, as shown in FIG. 3H.

On the other hand, as the output of the latch 22, i.e., the node N26, is latched by the logic "high" state and a node N261 is latched by the logic "low" sate, the node N26 is maintained in the logic "high" state even when the SC is continuously toggled at points t3 to t5.

As mentioned above, since the node N26 is maintained in the logic "high" state even when the SC is continuously toggled at the points t3 to t5, the actuating signal can be maintained in the logic "high" state as shown in FIGS. 3A through 3H.

Further, in the case that the SC dose not operate, that is, when the SC of the logic "high" state is changed to the logic "low" state at the point t5, the node N23 is changed from the logic "low" state to the logic "high" state, and the logic "high" signal of the node N23 becomes the logic "low" state through the inverter 216.

At this time, the nodes N25 and N26 continue to be maintained to the logic "high" state.

After that, since at the point t6, the node N23 and the node N26 are all logic in the "high" state, a node N27 that is the output of the NAND gate 231 is in the logic "low" state, a node N28 that is the output of the NOR gate 232 is in the logic "high" state, a node N29 that is the output of the NAND gate 233 is the logic "low" state, and the logic "high" signal of the node 25 N25 is changed to the logic "low" state after being delayed during a given period of time t6–t5, e.g., 100 ns, through the delay circuit as shown in FIG. 3F.

Thereby, the node N26 is changed from the logic "high" state to the logic "low" state. Thus, the actuating signal is changed from the logic "high" state to the logic "low" state.

After that, as at the point t3, the SC which was changed from the logic "low" state to the logic "high" state to be applied at the point t7 after a delay of loons is inverted into the logic "low" state through the inverter 20 to be applied to the pulse generator 21, thereby generating the actuating signal act1.

As discussed previously, in the present invention, since the power can be supplied during a given period of time in the case of partially requesting power supply during an operation of the chip, an advantage is that power required for the signal operation and data access can sufficiently be supplied. Accordingly, through the present invention, power can be supplied during a required period of time through the delay sensing circuit according to the length of the burst even in a synchronous electronic device which is being used at present. Moreover, the present invention has an advantage capable of preventing the signal operation characteristic and data access delay by stopping the power supply after the required period of time has passed.

It will be apparent to those skilled in the art that various modifications and variations can be made in an operation control circuit of a power supply unit of the present invention without departing from the spirit or scope of the invention. Thus, it is intended that the present invention cover the modifications and variations of this invention provided they come within the scope of the appended claims and their equivalents.

What is claimed is:

1. An operation control circuit of a power supply unit in a memory device outputting a given operation control signal used for supplying a power supply voltage when a main control signal of the memory device is operating, and additionally outputting said operation control signal in response to a sub control signal driven during said main control signal does not operate, said operation control circuit including:

a pulse generator receiving said sub control signal to output a first pulse signal and a second pulse signal;

a latch receiving said first pulse signal;

a delay sensing circuit receiving said first and second pulse signals to sense whether or not said sub control signal is continuously applied, and resetting said latch after a given time of delay; and an actuating signal generator of a power supply unit generating an operation control signal for making said power supply unit operate even when said sub control signal is continuously input during a given period of time as well as when said main control signal is operating;

wherein:

said latch further receives an output signal of said delay sensing circuit; and said actuating signal generator receives an AND combination signal of said main control signal and an inverted output signal from said latch.

2. An operation control circuit as claimed in claim 1, further comprising:

an inverter means for receiving said sub control signal and outputting an inverted signal of said sub control signal, wherein:

said pulse generator receives the inverted signal of said sub control signal; and a phase difference between said first and second pulse signals is 180 degrees.

3. An operation control circuit as claimed in claim 2, wherein said pulse generator includes:

a first inverter receiving the inverted signal of said sub control signal;

delay means receiving an output signal of said first inverter;

a first NAND gate receiving an output signal of said first inverter and an output signal of said delay means; and a second inverter receiving an output signal of said first NAND gate, wherein:

said output signal of said first NAND gate is said first pulse signal; and said output signal of said second inverter is said second pulse signal.

4. An operation control circuit as claimed in claim 3, wherein said latch includes:

a second NAND gate; and a third NAND gate;

wherein:

said second NAND gate receives said first pulse signal of said pulse generator and an output signal of said third NAND gate; and said third NAND gate receives the output signal of said delay sensing circuit and an output signal of said second NAND gate.

5. An operation control circuit as claimed in claim 4, wherein:

an output signal of said latch is an output signal of said second NAND gate.

6. An operation control circuit as claimed in claim 5, wherein said delay sensing circuit includes:

a fourth NAND gate receiving the output signal of said latch and said first pulse signal of said pulse generator;

a first NOR gate receiving an output signal of said fourth NAND gate and said second pulse signal of said pulse generator;

a fifth NAND gate receiving an output signal of said first NOR gate and said first pulse signal of said pulse generator;

a second NOR gate receiving an output signal of said fifth NAND gate and said second pulse signal of said pulse generator; and a sixth NAND gate receiving an output signal of said second NOR gate and said first pulse signal of said pulse generator.

* * * * *